United States Patent
Klein

(10) Patent No.: US 11,099,736 B2
(45) Date of Patent: *Aug. 24, 2021

(54) DYNAMIC PROCESSING OF STORAGE COMMAND BASED ON INTERNAL OPERATIONS OF STORAGE SYSTEM

(71) Applicant: Toshiba Memory Corporation, Tokyo (JP)

(72) Inventor: Yaron Klein, Raanana (IL)

(73) Assignee: Toshiba Memory Corporation, Tokyo (JP)

( * ) Notice: Subject to any disclaimer, the term of this patent is extended or adjusted under 35 U.S.C. 154(b) by 59 days.

This patent is subject to a terminal disclaimer.

(21) Appl. No.: 16/448,714

(22) Filed: Jun. 21, 2019

(65) Prior Publication Data

US 2019/0310772 A1 Oct. 10, 2019

Related U.S. Application Data

(63) Continuation of application No. 15/173,931, filed on Jun. 6, 2016, now Pat. No. 10,331,352.

(51) Int. Cl.
| | |
|---|---|
| G06F 12/00 | (2006.01) |
| G06F 3/06 | (2006.01) |
| G11C 16/26 | (2006.01) |
| G11C 16/10 | (2006.01) |
| G11C 16/30 | (2006.01) |
| G11C 7/04 | (2006.01) |
| G11C 16/34 | (2006.01) |

(52) U.S. Cl.
CPC ............ *G06F 3/061* (2013.01); *G06F 3/0653* (2013.01); *G06F 3/0659* (2013.01); *G06F 3/0679* (2013.01); *G06F 3/0688* (2013.01); *G11C 7/04* (2013.01); *G11C 16/10* (2013.01); *G11C 16/26* (2013.01); *G11C 16/30* (2013.01); *G11C 16/3495* (2013.01)

(58) Field of Classification Search
CPC ...... G06F 3/06; G06F 12/0246; G06F 3/0679; G06F 2212/2022; G06F 2212/7211; G06F 11/00; G06F 12/00; G06F 1/32; G06F 1/3225; G06F 3/061; G06F 3/0614; G06F 3/062; G11C 16/26; G11C 16/10; G11C 16/30; G11C 16/102; G11C 11/5628; G11C 11/5642

See application file for complete search history.

(56) References Cited

U.S. PATENT DOCUMENTS

| | | |
|---|---|---|
| 7,500,078 B2 | 3/2009 | Rangarajan et al. |
| 7,549,034 B2 | 6/2009 | Foster, Sr. et al. |
| 8,984,216 B2 | 3/2015 | Fillingim |
| 9,046,424 B2 | 6/2015 | Hsu et al. |
| 9,053,036 B2 | 6/2015 | Jain et al. |
| 9,165,668 B1 | 10/2015 | Zhao et al. |

(Continued)

*Primary Examiner* — Shawn X Gu
(74) *Attorney, Agent, or Firm* — White & Case LLP

(57) ABSTRACT

A device and method dynamically optimize processing of a storage command within a storage system. The device and method execute a rule based on predetermined criteria and internal operation parameters of the storage system. An extended application program interface within the storage system provides internal operation parameters for use in execution of the rule. Based on execution of the rule, the storage system controls processing of the storage command.

22 Claims, 11 Drawing Sheets

(56) References Cited

U.S. PATENT DOCUMENTS

| | | |
|---|---|---|
| 2002/0091965 A1 | 7/2002 | Moshayedi |
| 2007/0106860 A1 | 5/2007 | Foster et al. |
| 2008/0177922 A1 | 7/2008 | Chow et al. |
| 2009/0091996 A1 | 4/2009 | Chen et al. |
| 2010/0023678 A1 | 1/2010 | Nakanishi et al. |
| 2011/0060927 A1 | 3/2011 | Fillingim et al. |
| 2011/0119430 A1 | 5/2011 | Lai et al. |
| 2011/0320709 A1 | 12/2011 | Han et al. |
| 2012/0203986 A1 | 8/2012 | Strasser et al. |
| 2012/0239976 A1* | 9/2012 | Cometti ................. G11C 16/10 714/24 |
| 2013/0124888 A1* | 5/2013 | Tanaka ................... G11C 16/06 713/320 |
| 2013/0191578 A1* | 7/2013 | Goss ....................... G06F 12/10 711/102 |
| 2014/0059270 A1 | 2/2014 | Zaltsman et al. |
| 2014/0101371 A1 | 4/2014 | Nguyen et al. |
| 2014/0195725 A1 | 7/2014 | Bennett |
| 2014/0229654 A1 | 8/2014 | Goss et al. |
| 2014/0281121 A1* | 9/2014 | Karamcheti .......... G06F 9/4881 711/102 |
| 2014/0281311 A1 | 9/2014 | Walker et al. |
| 2014/0365714 A1 | 12/2014 | Sweere et al. |
| 2015/0081973 A1 | 3/2015 | Shachar et al. |
| 2015/0149700 A1 | 5/2015 | Lucas et al. |
| 2015/0153962 A1 | 6/2015 | Salessi et al. |
| 2015/0235706 A1 | 8/2015 | Chu |
| 2015/0269018 A1 | 9/2015 | Ellis |

\* cited by examiner

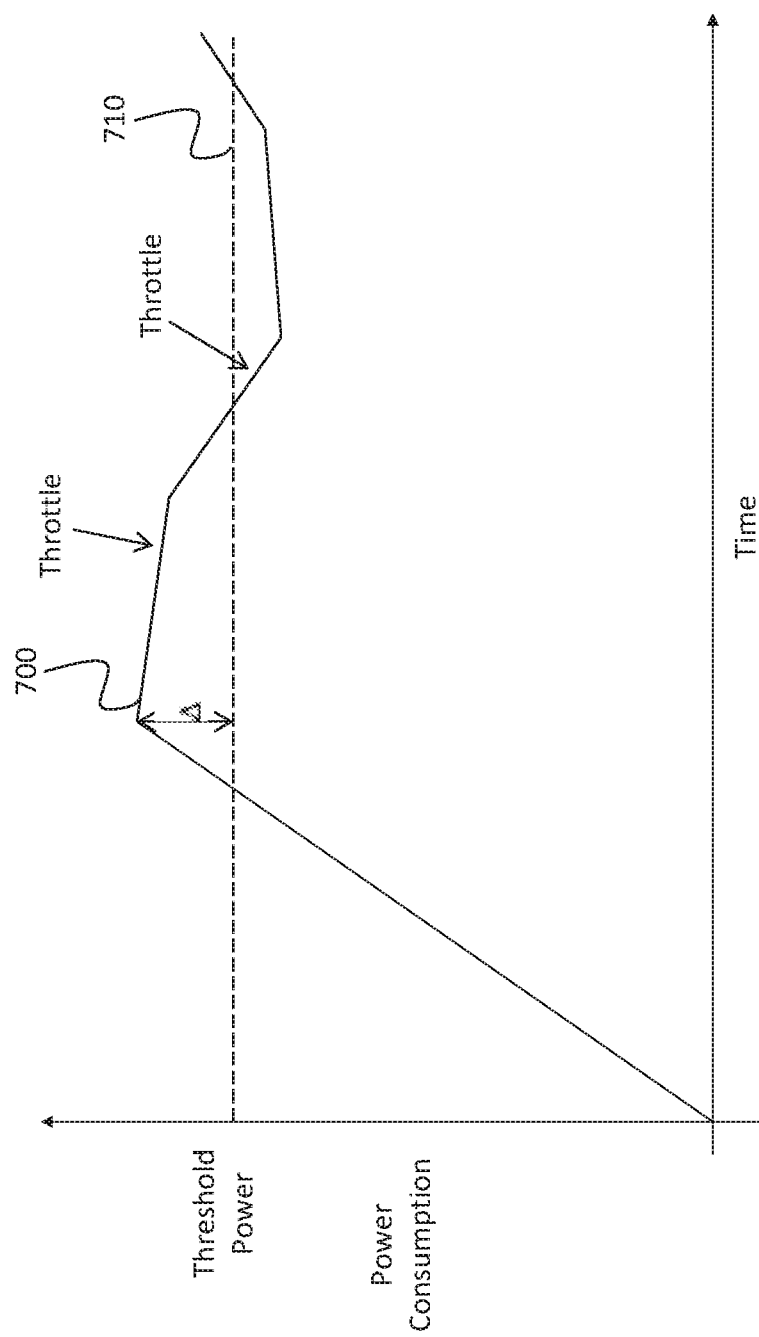

DYNAMIC PROCESSING OF STORAGE COMMAND BASED ON INTERNAL OPERATIONS OF STORAGE SYSTEM

CROSS-REFERENCE TO RELATED CASES

This application is a continuation of application Ser. No. 15/173,931 filed Jun. 6, 2016, now U.S. patent Ser. No. 10/331,352, the entire contents of which is incorporated herein by reference.

FIELD OF THE INVENTION

This invention generally relates to optimizing the performance of a storage system at the pool and/or solid state drive (SSD) level.

BACKGROUND OF THE INVENTION

Nonvolatile memory devices (NVMs), such as flash memory devices, are widely used in a variety of applications such as universal serial bus (USB) drives, digital cameras, mobile phones, smart phones, tablet personal computers (PCs), memory cards, and solid state drives (SSDs). A flash memory device is typically organized into a plurality of memory blocks, pages, and memory cells, where each of the memory blocks comprises a plurality of pages, and each of the pages comprises a plurality of memory cells.

Flash Translation Layers (FTLs) embedded in flash memory devices, such as SSDs, facilitated the widespread adoption of flash memory devices by enabling host computers to communicate with flash memory devices via conventional read/write hard disk drive (HDD) interfaces. To achieve this benefit, FTLs translate commands to/from a host device or remote application by mapping the logical addresses used by host computer or remote application to the physical addresses of the data in the flash memory devices. The physical data in a flash memory device is accessible via a low level command interface to read, program (write) and erase memory locations.

Conventional HDD interfaces employed by SSDs shield flash memory device operation parameters, such as power consumption, operating temperature, and erase count, from components external to the SSD, such as applications on a host. Host applications therefore process commands which arrive without any reference to the internal operations of the SSD. For example, if an incoming write command is directed to a particular storage location that is operating at a dangerous temperature (i.e., overheating), there is currently no mechanism for processing the write command in a manner that avoids further taxing the overheating storage location.

Recent types of SSD, known as Open Channel SSDs, suffer from the same problems. These SSDs share data management responsibilities with the host computers by having some of the FTL functionality implemented in the host computer, which allows the host computer more control over the flash memory device's resources and the ability to manage multiple Open Channel SSDs using a global FTL in the host computer. The Linux 4.4 kernel is one example of an operating system kernel that supports Open Channel SSDs, which follow the NVM Express™ specification, by providing an abstraction layer called LightNVM. However, APIs for Open Channel SSDs still shield some information regarding a flash memory device operation parameters from global FTLs.

There is, therefore, an unmet demand to optimize the performance of non-volatile solid state storage devices (e.g. SSDs) by dynamically adjusting processing of incoming commands based on internal operation information of SSDs.

BRIEF DESCRIPTION

In one embodiment, a method for dynamically optimizing processing of a command within a storage system including monitoring one or more internal operation parameters for each of a plurality of nonvolatile memory storage locations of the storage system, receiving a command to access a first nonvolatile memory storage location of the plurality of nonvolatile memory storage locations, comparing the one or more internal operation parameters of the first nonvolatile memory storage location to predetermined internal operation criteria for the first nonvolatile memory storage location, and in response to the one or more internal operation parameters failing to satisfy the predetermined internal operation criteria, controlling execution of the command to access the first storage location in a manner to mitigate an effect of the one or more internal operation parameters failing to satisfy the predetermined internal operation criteria.

In one embodiment, the controlling execution step of the method includes throttling execution of the command to access the first nonvolatile memory storage location.

In one embodiment, the command in the method is a write or read command.

In one embodiment, the throttling execution of the method includes calculating a throttling value based on the predetermined internal operation criteria and the one or more internal operation parameters of the first nonvolatile memory storage location, wherein the throttling value corresponds to a deferred time to execute the command.

In one embodiment, the method further includes the step of controlling execution comprising identifying a second nonvolatile memory storage location of the plurality of nonvolatile memory storage locations that is different from the first nonvolatile memory storage location and executing the command to access the second nonvolatile memory storage location.

In one embodiment, the method includes a write command.

In one embodiment, the method includes identifying the first nonvolatile memory storage location from the command, retrieving the one or more internal operation parameters of the first nonvolatile memory storage location, and comparing the one or more internal operation parameters of the first nonvolatile memory storage location with the predetermined internal operation criteria for the first nonvolatile memory storage location.

In one embodiment, the method includes determining an action for execution of the command that lowers power consumption for the first nonvolatile memory storage location.

In one embodiment, the method includes determining an action for execution of the command that lowers an operating temperature of the first nonvolatile memory storage location.

In one embodiment, the method includes one or more internal operation parameters for each of the plurality of nonvolatile memory storage locations of the storage system includes one or more of erase count, power consumption, current or average operating temperature, and amount of fragmentation.

In one embodiment, the method includes comparing one or more internal operation parameters for each of the plurality of nonvolatile memory storage locations with a corresponding predetermined power, temperature threshold, or fragmentation value for each of a plurality of nonvolatile memory storage locations; and ranking the plurality of nonvolatile memory storage locations from a most to a least optimal storage location for storing data based on power or temperature.

In one embodiment, the method includes selecting the most optimal storage location of the plurality of nonvolatile memory storage locations from ranking the plurality of nonvolatile memory storage locations, and executing the command to access the one of the highly ranked plurality of nonvolatile memory storage locations.

In one embodiment, the method includes one or more internal operation parameters comprising at least one of a power consumption of the storage system, an internal temperature of the storage system, an erase count of the storage system, a number of free blocks within the storage system, and a fragmentation level of the storage system.

In one embodiment, the method includes one or more internal operation parameters comprising at least one of a maximum power consumption of the storage system, a maximum internal temperature of the storage system, and a maximum erase count of the storage system.

In one embodiment, the method includes predetermined internal operation criteria specifying at least one of a quality-of service level of the storage system, a service level agreement parameter of the storage system, and a life-time parameter of the storage system.

In one embodiment, the method includes a storage system that is a solid-state drive and non-volatile memory storage locations that are non-volatile memory devices.

In one embodiment, the method includes a storage system that is a storage appliance and the non-volatile memory storage locations are solid-state drives (SSDs).

In one embodiment, a device for dynamically optimizing processing of a command within a storage system includes a plurality of non-volatile memory storage locations for storing data, a memory for storing one or more internal operation parameters for each of the non-volatile memory storage locations, a controller for, in response to receiving a command to access a first non-volatile memory storage location of the plurality of non-volatile memory storage locations, comparing the one or more internal operation parameter of the first nonvolatile memory storage location to predetermined internal operation criteria for the first non-volatile memory storage location, and, in response to one or more internal operation parameters failing to satisfy the predetermined internal operation criteria, controlling execution of the command to access the first storage location in a manner to mitigate an effect of the one or more operation parameters failing to satisfy the predetermined internal operation criteria.

In one embodiment, the device includes an extended API that enables the controller to access internal operation parameters and predetermined internal operation criteria stored in the memory.

In one embodiment, the device includes non-volatile memory storage locations that are Open Channel SSDs.

BRIEF DESCRIPTION OF THE FIGURES

FIG. 7 illustrates the effect of throttling commands based on the power usage (and by extension, the temperature) of a storage location, according to one embodiment of the invention.

DETAILED DESCRIPTION

An extended application programming interface ("API") described below provides access to operation parameters of a nonvolatile memory ("NVM") based storage device (e.g., solid-state drive or SSD) or pool of SSDs (e.g., a storage appliance). Components external to the extended API, such as a global FTL, use the operational parameters to optimize the performance of the SSD. For example, a global FTL can optimize performance by throttling incoming commands or balancing input/output operations to different storage locations within the SSD or SSDs.

Controller 101 can process additional inputs, such as predetermined criteria, to determine an optimizing action for processing commands. By taking into consideration operation parameters of an SSD as well as predetermined criteria in processing commands, a controller for an SSD or SSDs can optimize memory performance more efficiently than prior art storage systems thereby mitigating the effects of the operation parameters failing to satisfy the predetermined criteria. As will now be discussed, FIGS. 1-7 below illustrate various embodiments of the extended API and using the operation parameters of an SSD for optimizing the performance of an SSD or SSDs thereby mitigating the effects of the operation parameters failing to satisfy the predetermined criteria.

Figure 1:
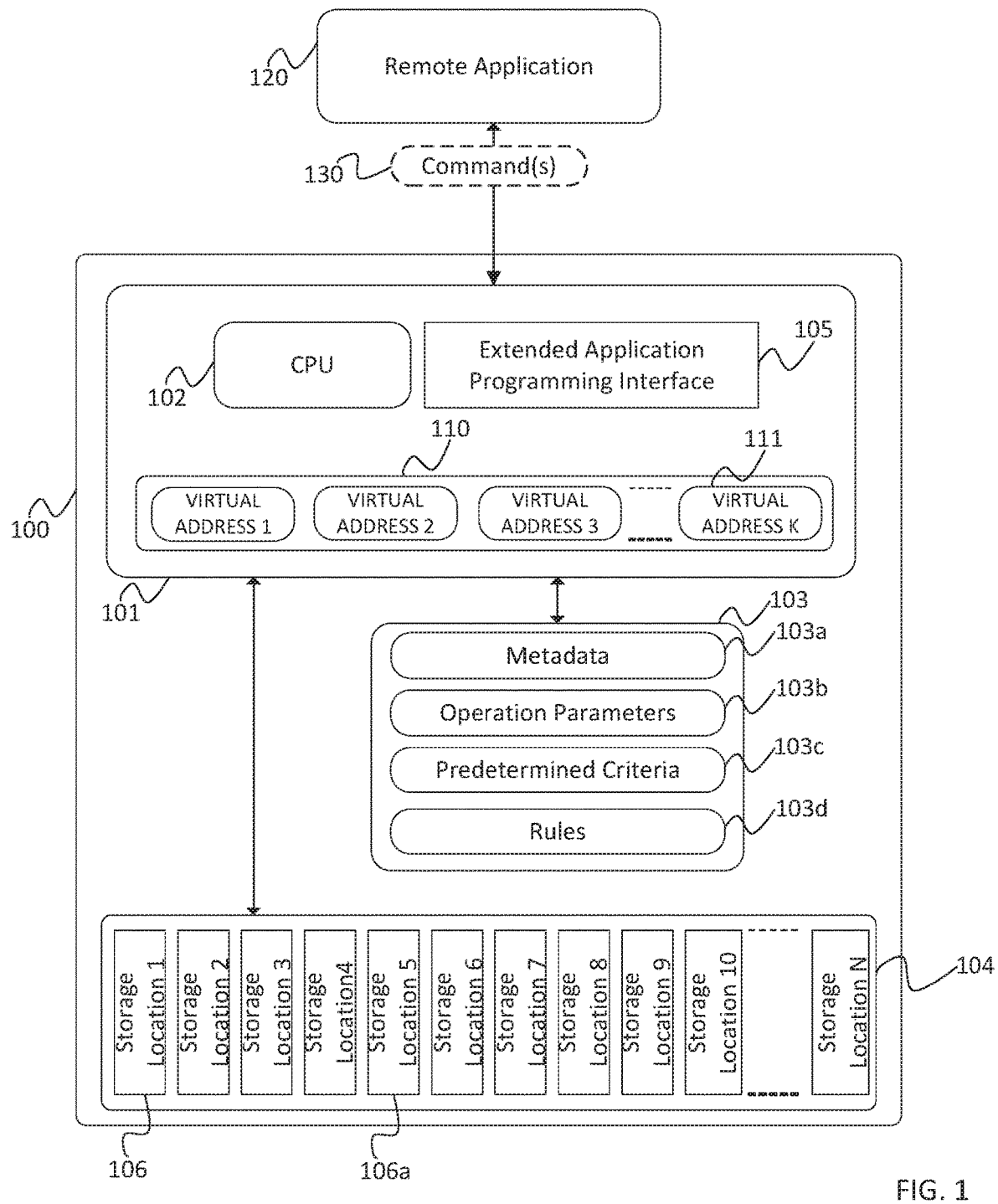
FIG. 1 is a block diagram of a storage system, according to one embodiment of the invention.

FIG. 1 is a block diagram of storage system 100 and remote application 120. Storage system 100 includes a controller 101, having a flash-translation layer ("FTL") 110 and processor ("CPU") 102, memory 103, extended application-programming interface ("API") 105 and storage subsystem 104 comprising, a plurality of N storage location(s) 106, where N is an integer greater than 1. In one embodiment, storage system 100 is a non-volatile storage device, such as a solid-state drive ("SSD"), and storage location(s) 106 are storage locations or NVMs with the SSD. In another embodiment, storage system 100 is a storage appliance, and storage location(s) 106 are a plurality of SSDs; in this embodiment, storage sub-system 104 represents a pool of storage location(s) 106 or SSDs.

Storage system 100 includes storage subsystem 104 connected to controller 101. Memory 103 stores information related to operation of the storage system 100 including, but not limited to, metadata 103a, operation parameter(s) 103b, predetermined criteria 103c, and rules 103d. Metadata 103a can include information related to mapping storage location(s) 106 to virtual addresses 111. Metadata 103a enables FTL 110 to translate virtual addresses 111 (known to remote application 120) to physical addresses in storage location(s) 106. In one embodiment, remote application 120 has access to multiple K virtual addresses 111, where K is an integer greater than 1.

In the embodiment when storage system 100 is a single SSD, virtual addresses 111 are namespaces for accessing the storage locations 106 or NVMs of the SSD. In the embodiment when storage system 100 is a storage appliance, virtual addresses 111 are logical unit numbers (LUNs) for accessing the storage locations 106 or individual SSDs of the storage appliance. In other words, FTL 110 uses metadata 103a to manage the plurality of storage location(s) 106 by making them accessible to remote application 120 using virtual addresses 111.

Operational parameter(s) 103b include information related to measured or monitored operation conditions of one or more storage location(s) 106 within subsystem 104. Two or more storage location(s) 106 form a pool. For example, operation parameter(s) 103b include: power consumption for each storage location(s) 106; overall power consumption of a pool of storage location(s) 106 (more than one) or the entire storage subsystem 104; historical and/or current temperature for each storage location(s) 106; overall historical and/or current temperature of a pool of storage locations 104 or the entire storage subsystem 104; a number of program/erase (P/E) cycles for each storage location(s) 106; and/or amount of fragmentation for each storage location(s) 106.

The controller 101 uses the extended API 105 to calculate operation parameter(s) 103b for a pool of storage location(s) 106 by aggregating measured operation parameter(s) 103b for each storage location(s) 106 that is part of the pool. Similarly, the controller 101 uses the extended API 105 to calculate operation parameter(s) 103b for the entire subsystem 104 by aggregating measured operation parameter(s) 103b for each storage location in subsystem 104.

Predetermined criteria 103c includes information related to quality of service parameters, service level agreements, and/or expected lifetime of individual storage location(s) 106 or a pool of storage location(s) 106 within storage subsystem 104. There are multiple sources for predetermined criteria 103c. A user can manually define parameters. Alternatively, quality of service or service level agreements can define requirements regarding the operation of storage system 100 based on agreed upon terms in the agreements. A service level agreement is an agreement between a client and a service provider that defines a minimum level of service expected from storage system 100. A service level agreement can include required quality of service parameters such as input/output throughput requirements, average command response time, or priority rankings of each storage location(s) 106. A user can establish other predetermined criteria 103c such as threshold values for the operation parameter(s) 103b. For example, the threshold values can apply to the storage system 100, individual storage location(s) 106, or a pool of storage location(s) 106 and can include a maximum value of power consumption, maximum temperature, or expected lifetime (i.e., the time period that storage location(s) 106 are expected to work).

Rules 103d determine how command(s) 130 are to be processed based on the parameters within command(s) 130, related operation parameter(s) 103b, and related predetermined criteria 103c. Controller 101 executes rules 103d based on this information to determine optimizing actions for command(s) 130. As one example, execution of rules 103d can result in a throttling action where command(s) 130 is held (i.e., throttled) for a certain period of time before execution of the command. This period of time can be preset by the manufacturer or dependent on operation parameter(s) 103b. For example, if an operation parameter(s) 103b for a storage location(s) 106a indicates the temperature of storage location(s) 106a exceeds a threshold value set as a predetermined criteria 103c, command(s) 130 directed to storage location(s) 106a can be held (i.e., throttled) until the temperature of storage location(s) 106a drops below the threshold value. As another example, if an operation parameter(s) 103b for storage subsystem 104 indicate the overall temperature of storage subsystem 104 exceeds a threshold value set as a predetermined criteria 103c, any command(s) 130 directed to any storage location(s) 106a in storage system 104 can be held (i.e., throttled) until the current temperature of storage system 104 drops below the threshold value.

Rules 103b can balance input/output operations of storage location(s) 106 by selecting a different storage location(s) 106 that has more free space, lower power consumption, balancing erase counts across the pool of storage location(s) 106 (i.e., pool level wear leveling), optimize power consumption across a pool of storage location(s) 106, and/or satisfy power consumption, temperature, and/or P/E thresholds for a pool of storage location(s) 106.

Examples of rules discussed above are exemplary and other rules directed to optimizing the performance of the storage system and storage locations are possible Extended API 105 enables access by controller 101 and/or FTL 110 to operation parameter(s) 103b of storage location(s) 106 and/or subsystem 104. Controller 101 uses operation parameter(s) 103b in processing command(s) 130 received from remote host 120 in order to optimize performance of storage location(s) 106 and/or subsystem 104.

Figure 2A:
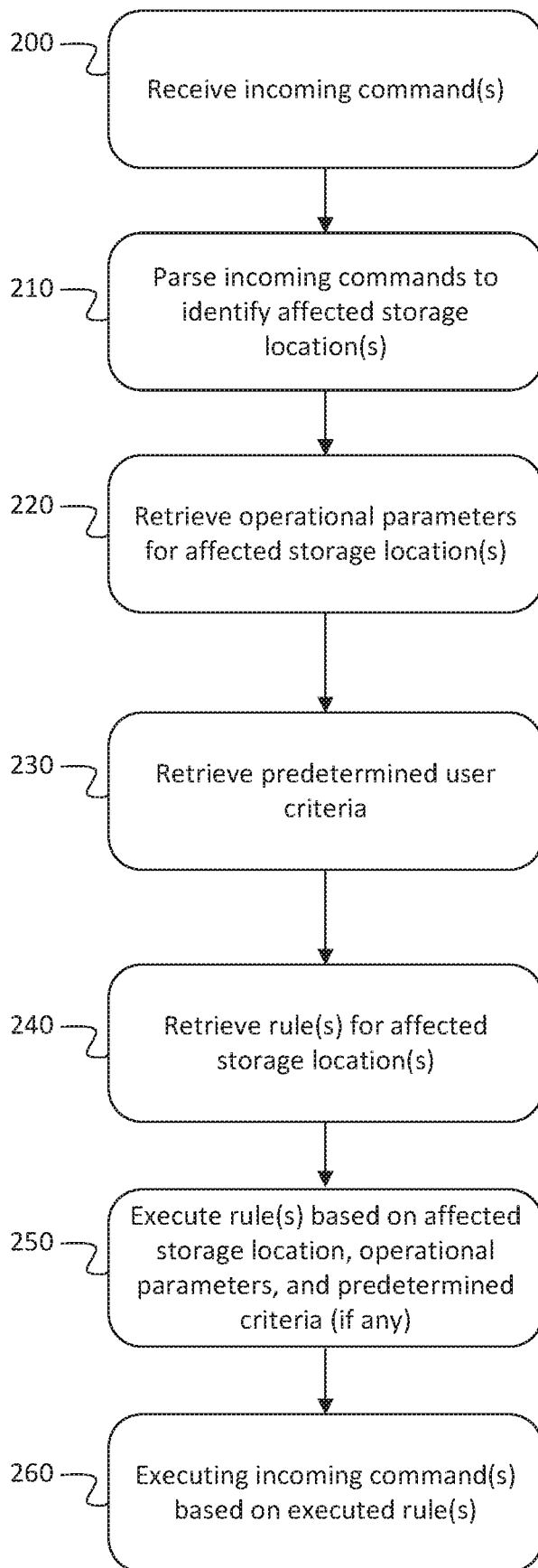
FIG. 2A is a flow chart illustrating the operation of storage system of FIG. 1, according to one embodiment of the invention.

FIG. 2A is a flow chart illustrating the operation of storage system 100 according to one embodiment of the invention. In step 200, FTL 110 in controller 101 receives command(s) 130 from a remote application 120. In step 210, FTL 110 in controller 101 parses command(s) 130 to determine the type of command (e.g., read or write) and the affected storage location(s) 106 (e.g., if a write command, the storage location(s) to which the data is to be stored). Prior to executing command(s) 130, controller 101 optimizes execution of command (s) 130 as represented by steps 220-260. In step 220, controller 101 retrieves operation parameter(s) 103b associated with the affected storage location(s) 106. Extended API 105 provides access to these operation parameter(s) 103b, which are stored in memory 103.

In step 230, controller 101 retrieves any predetermined criteria 103c associated with the affected storage location(s) 106. Controller 101 then proceeds to retrieve any rules 103d associated with the affected storage location(s) 106 in step 240. In step 250, after determination of the affected storage location(s) 106 and retrieval of operation parameter(s) 103b, predetermined criteria 103c, and rule(s) 103d, controller 101 executes the rule(s) 103d in step 260.

Figure 2B:
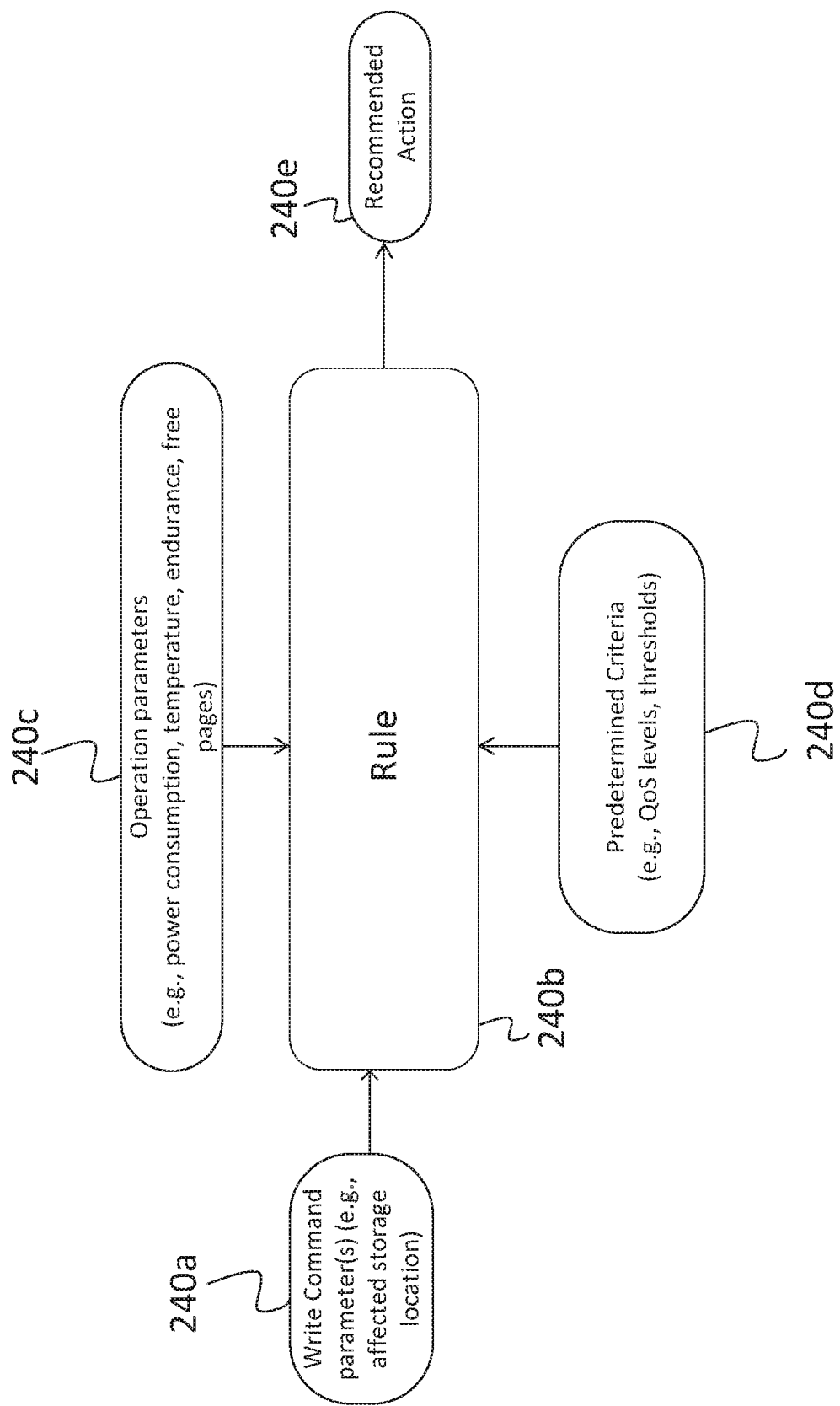
FIG. 2B is a flow chart illustrating the sub-steps of a step in the flow chart of FIG. 2A.

FIG. 2B is a flow chart showing the sub-steps of step 240. In sub-step 240a, controller 101 retrieves parameters from command(s) 130. In sub-step 240c, controller 101 retrieves operation parameters 240c. In sub-step 240d, controller 101 retrieves predetermined criteria 103c. In sub-step 240b, controller 101 provides this retrieved information as inputs for rule(s) 103d. In sub-step 240e, execution of rule(s) 103d results in an action(s) that optimizes processing of command(s) 130. As one example, the action requires throttling command(s) 130 or identifying a new storage location(s) 106 for storing data included in command(s) 130.

Figure 2C:
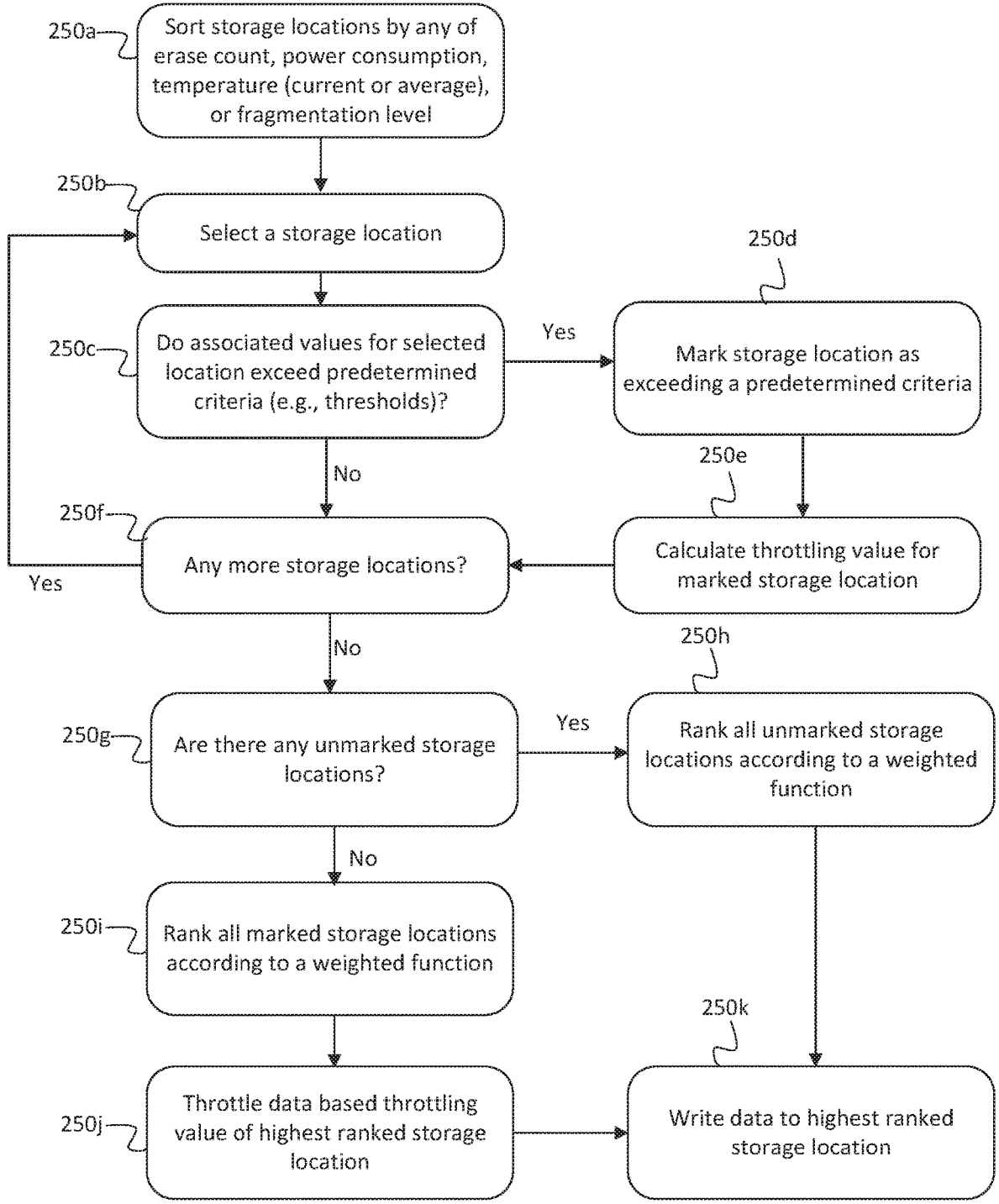
FIG. 2C is a flow chart illustrating the sub-steps of a step in the flow chart of FIG. 2A, according to one embodiment of this invention.

FIG. 2C provides a flow chart of one possible rule for optimizing processing of command(s) 130, where the command(s) 130 is a write command, according to one embodiment of this invention. In step 250a, controller 101 organizes storage location(s) 106 of the storage subsystem 104 by sorting them into a list according to at least one parameter including erase count, amount of current power consumption, current or average operating temperature, and amount of fragmentation. After sorting, controller 101 selects a storage location(s) 106 from the sorted list in step 250b. Controller 101 determines whether the measured values of operation parameter(s) 103b of the selected storage location(s) 106 exceed predetermined criteria 103c (e.g., thresholds, QoS requirements) of the selected storage location(s) 106 in step 250c. If yes, controller 101 marks the selected storage location(s) 106 and calculates a throttling value in steps 250d and 250e, respectively. As one example, controller 101 marks a storage location(s) 106 if the current temperature exceeds a threshold value (saved within predetermined criteria 103c) for that storage location(s) 106. In one embodiment of step 250e, controller 101 calculates the throttling value according to the difference between a current value for an operation parameter(s) 103b (e.g., power consumption, temperature, or erase counts) and a threshold value (saved as a predetermined criteria 103c) for the operation parameter(s) 103b. As one example, controller 101 calculates the throttling value by a weighted function:

$$T = k_1 \times \Delta,$$

where T is the throttling value (e.g., time to wait before executing the write command), $\Delta$ is the difference between a current value for operation parameter(s) 103b and a threshold value (saved as predetermined criteria 103c) for operation parameter(s) 103b, and $k_1$ is a predetermined weighted variable. As another example of the weighted function, controller 101 calculates a throttling value using a summation of the deltas of a plurality of operation parameter(s) 103b:

$$T_{IO} = k_1 \times \Delta + k_2 \times \int \Delta,$$

where $k_2$ is a predetermined weighted variable and $\int \Delta$ represents a summation of deltas.

Controller 101 can apply these weighted functions to any operation parameter(s) 103b including power consumption, temperature, and erase counts, to determine whether to throttle command(s) 130 or balance input/output (I/O) operations of a storage location(s) 106 (e.g., by dynamically selecting different storage locations to service the command). Throttling command(s) 130 or balancing I/O operations at a storage location optimizes performance of storage subsystem 104 by reducing the power consumption and operating temperature of storage subsystem 104. The number of commands processed by storage location(s) 106 affects the power consumption of storage location(s) 106. In other words, reducing (or increasing) the number of command(s) 130 processed by storage location(s) 106 results in reducing (or increasing) the power consumption of storage location(s) 106. Similarly, power consumption of storage location(s) 106 directly affects the operating temperature of storage location(s) 106. In other words, reducing (or increasing) power consumption of storage location(s) 106 results in reducing (or increasing) the operating temperature of storage location(s) 106. Thus, throttling command(s) 130 and/or balancing I/O operations optimize the power consumption and operating temperature of storage location(s) 106. The weighted functions above are merely examples for calculating throttling values, and other functions are within the scope of the invention.

In step 250f, if the measured values of operation parameter(s) 103b do not exceed any thresholds (saved as predetermined criteria 103c), storage location(s) 106 is not marked and controller 101 proceeds to the next storage location(s) 106, if any. After selecting all storage location(s) 106, controller 101 determines whether there are any unmarked storage location(s) 106 in step 250g. If no (i.e., at least one measured value of operation parameter(s) 103b for all storage location(s) 106 exceed a threshold saved as predetermined criteria 103b), controller 101 ranks the marked storage location(s) 106 according to a weighted function in step 250i. As one example, the weighted multi-criteria function in step 250i is:

$$f_1 = w_1 \cdot OP + w_2 \cdot \text{power} + w_3 \cdot \text{Temperature} + w_4 \cdot \text{endurance} + w_5 \cdot IO,$$

where $w_1$, $w_2$, $w_3$, $w_4$, and $w_5$ represent preset weighting values, OP represents the number of free pages, power represents the power consumption, temperature represents the operating temperature of storage location(s) 106, endurance represents the erase count of storage location(s) 106, and IO represents the calculated throttling value. In this example, the weighted function computes a ranking for the storage location(s) 106 that is inversely proportional with the number of free pages, and proportional to power consumption, operating temperature, erase count, and throttling value. After ranking of the marked storage location(s) 106 in step 250i, controller 101 selects the highest ranked storage location(s) 106 and throttles the command(s) 130 based on the throttling value in step 250j. After throttling, controller 101 writes the data from the command(s) 130 to the selected storage location(s) 106 in step 250k.

In this embodiment, preference is given to unmarked storage location(s) 106 (i.e., locations in which no operation parameter(s) 103b exceeds a threshold value saved as predetermined criteria 103c) in step 250h. Controller 101 ranks any unmarked storage location(s) 106 using a weighted multi-criteria function. As one example, the weighted multi-criteria function is:

$$f_2 = w_1 \cdot OP + w_2 \cdot \text{power} + w_3 \cdot \text{Temperature} + w_4 \cdot \text{endurance}$$

In this example, the weighted function does not include IO as a factor since the unmarked storage locations do not have a throttling value. Controller 101 selects a highest-ranking storage location(s) 106 and writes the data from the command(s) 130 to the selected storage location 160 in step 250k.

Figure 3:
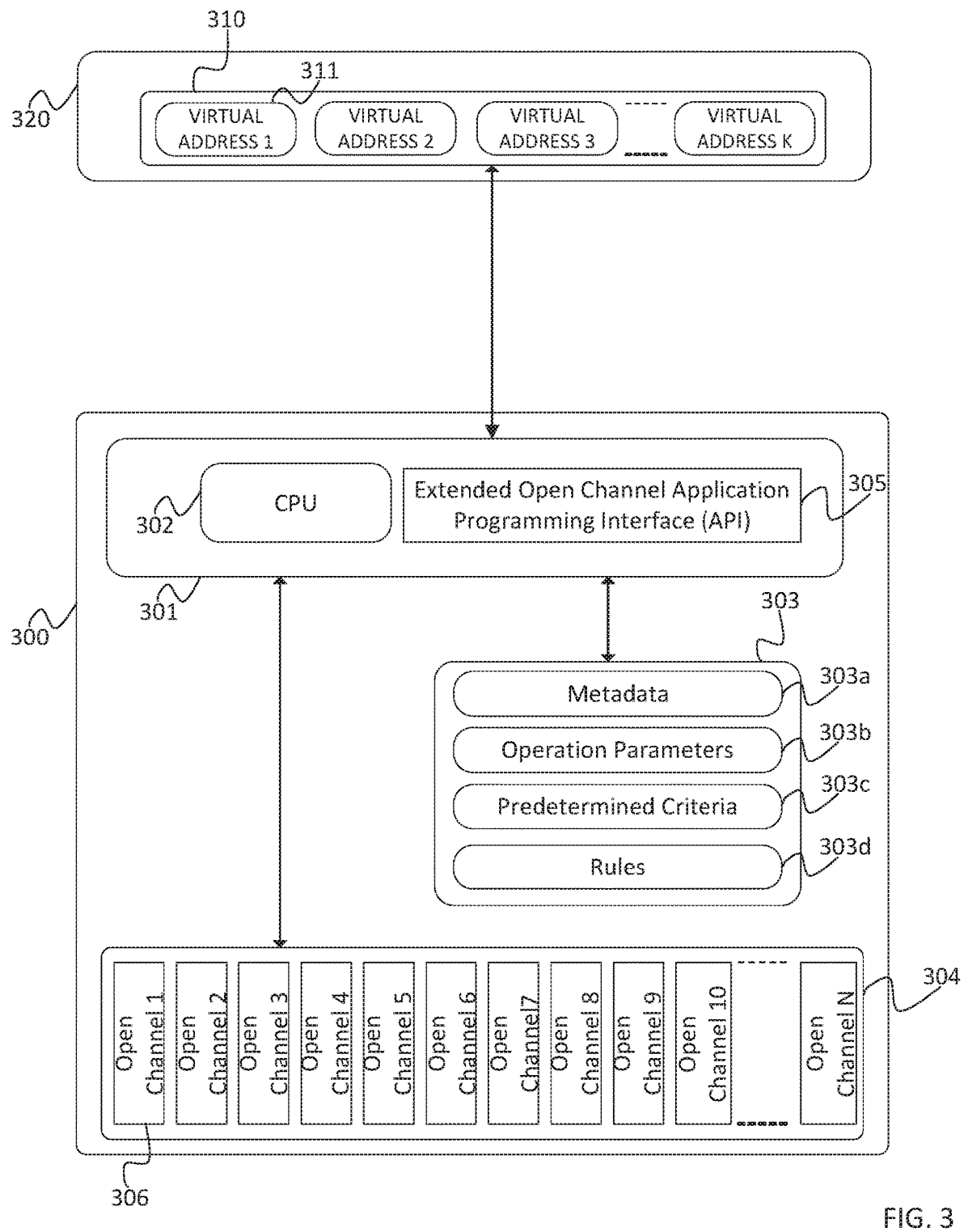
FIG. 3 is a block diagram of an Open Channel storage system, according to one embodiment of the invention.

FIG. 3 is a block diagram of a storage system that implements storage locations 306 as Open Channel SSDs. Open Channel SSDs are SSDs that may not have all the FTL implemented within the device. Instead, the remote host or application 320 includes FTL 310. In this embodiment, a controller 301 includes a CPU 302 and an extended Open Channel API 305 that enables the host FTL 310 to access operation parameters 303b stored in memory 303. Extended Open Channel API 305 provides internal operation parameters of storage system 300, such as power consumption and operating temperature of storage system 300. Open Channel device 306 within a storage subsystem 304 each include a standard Open Channel API 305, through which the controller 301 interfaces with the Open Channel devices.

FIGS. 2A-2C describe steps performed by systems 100 of FIG. 1 and system 300 of FIG. 3 to throttle commands as one example of an optimizing action for processing commands.

FIGS. 4-7 provide another example of an optimizing action and illustrate balancing I/O operations through selection of a different storage location for executing commands. While the following discussion references system 100 of FIG. 1, system 300 of FIG. 3 also is capable of performing the steps below.

Figure 4A:
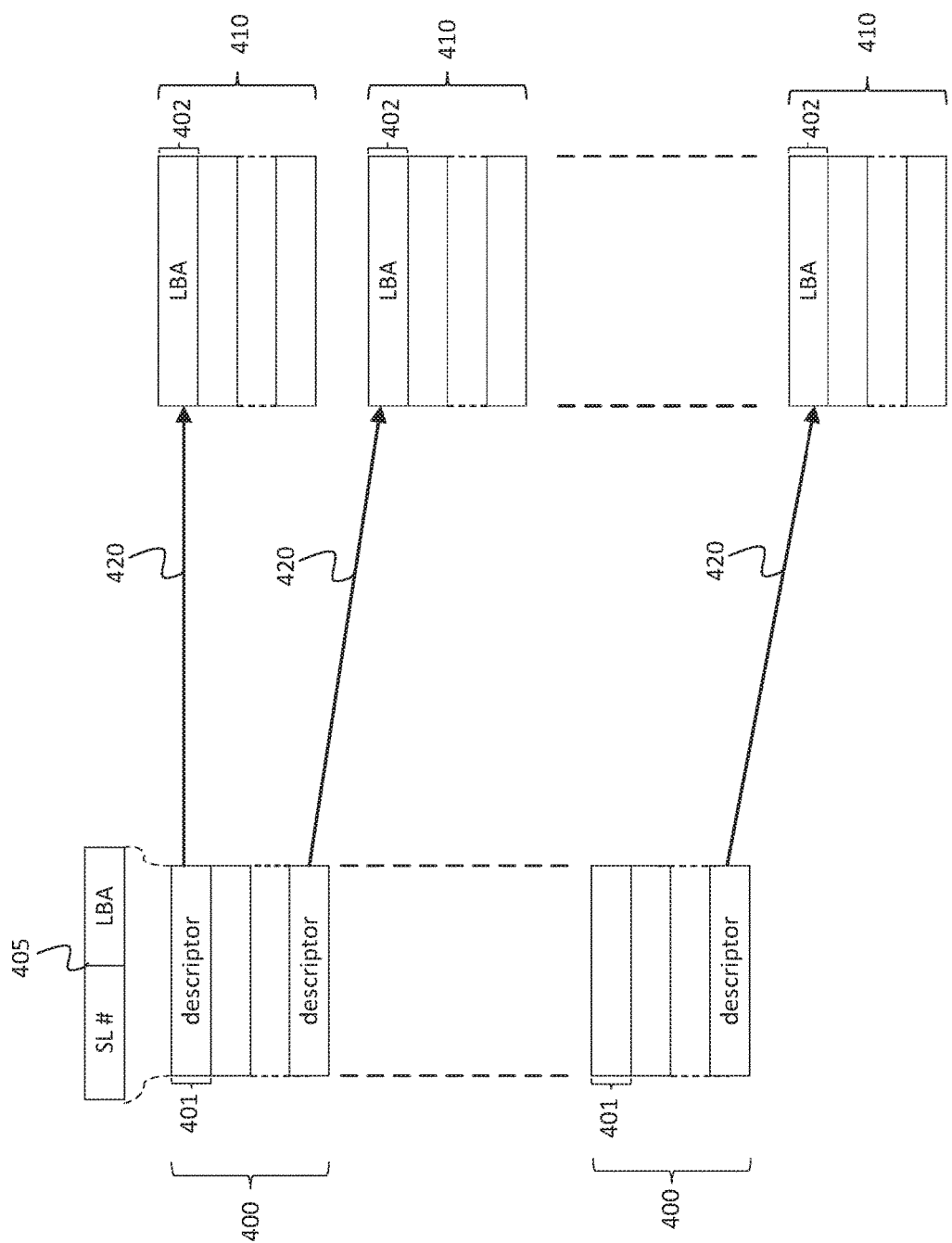
FIG. 4A is a diagram illustrating logical address to physical location mapping in a storage system, according to one embodiment of this invention.

FIG. 4A illustrates a logical address to physical location mapping in storage system 100 according to one embodiment of this invention. In this embodiment, storage system 100 is an SSD. In another embodiment, storage system 100 can be a storage appliance. Virtual addresses 400 include segments called fixed size chunks 401. In one embodiment, virtual addresses 400 are LUNs. In another embodiment, virtual addresses 400 are namespaces. For compatibility with NAND memory geometry, the chunk size is 4 kilobytes.

Each virtual chunk 401 includes a descriptor containing a mapping 405 to a physical storage location 410. Mapping information 405 includes an identification (SL #) of a storage location 410 and a logical block address (LBA) 402 within storage location 410. Mapping information 405 can be stored as metadata and is accessible by controller 101. Mapping information 405 in each virtual chunk 401 points 420 to a corresponding LBA 402 within a storage location 410. In an embodiment where storage system 100 is a storage appliance, storage location 410 is an SSD and the physical storage location identification is an SSD ID.

As described above, an optimizing action for processing write command(s) 130 can cause selection of a SSD 410 that is different from current SSD storing command(s)' data. In one embodiment, command(s) are write commands. Selecting a different SSD 410 for placing data requires dynamically updating the mapping (represented by pointers 420) between virtual addresses 400 to SSD 410. That is, controller 101 can update the physical location of data associated with a virtual chunk 401 based on operation parameter(s) 103b of SSD 106.

Figure 4B:
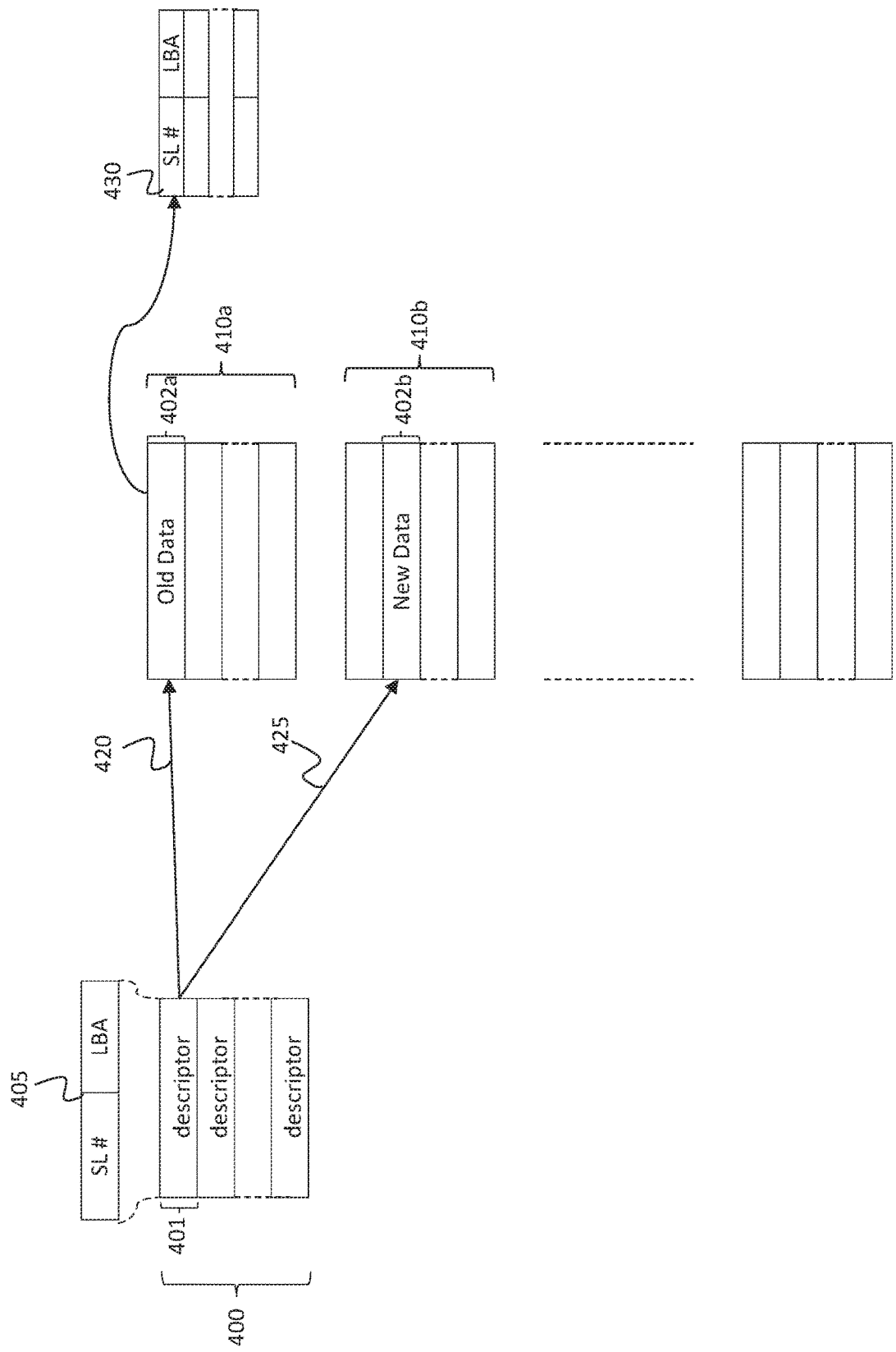
FIG. 4B is a diagram illustrating updating logical address to physical location mapping information, according to one embodiment of this invention.

FIG. 4B illustrates the process of updating mapping information 405 between a logical and physical address after selection of a different SSD 106 during processing of command(s) 130. Prior to receiving command(s) 130, virtual chunk 401 in virtual address 400 originally contains mapping information 405 to an LBA 402a within a SSD 410a. Upon receiving an incoming command that requires processing (e.g., writing) data of virtual chunk 401, controller 101 uses mapping information 405 to identify LBA 402a to which the data is to be written. In one embodiment, after executing a rule(s) as describe above, controller 101 can select a different LBA 402b in SSD 410b and writes the data to LBA 402b. This action can be a result of controller 101 determining that SSD 410a exceeds a threshold value for power consumption, operating temperature, or number of erase counts. Controller 101 places data from command(s) 130 in the new location associated with LBA 402b in SSD 410b. In addition, controller 101 modifies the descriptor of virtual chunk 401 such that it points 425 to LBA 402b in SSD 410b. A TRIM command is sent to SSD 410a to evict data at address 402b.

Figure 5A:
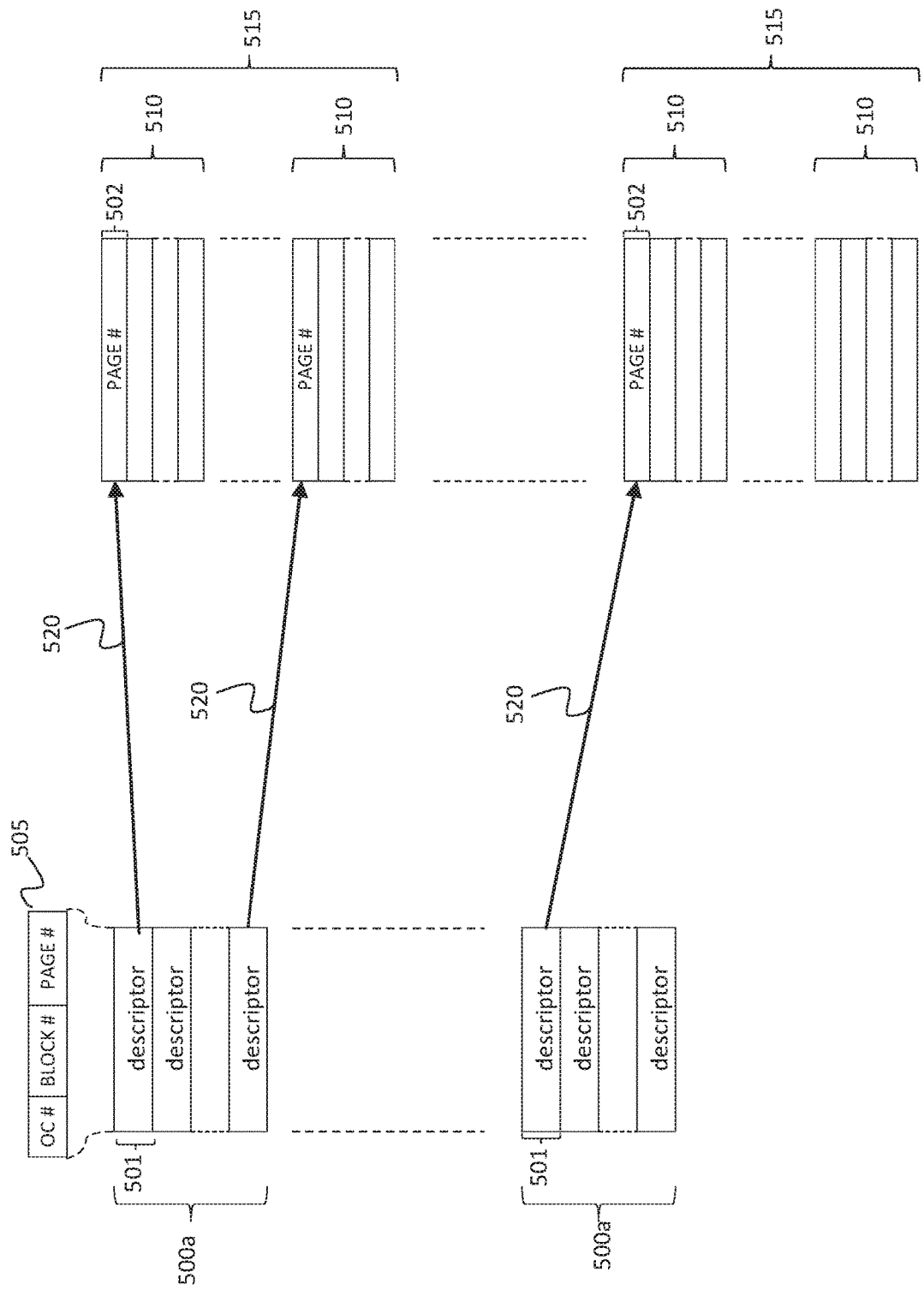
FIG. 5A is a diagram illustrating logical addresses to physical location mapping in an Open Channel storage system, according to another embodiment of this invention.

FIG. 5A illustrates a virtualization mechanism mapping logical addresses to physical locations in an Open Channel storage system according to another embodiment of this invention. In this embodiment, storage system 100 is an Open Channel SSD. Virtual addresses 500 includes segments called fixed-size virtual chunks 501. For compatibility with NAND geometry, the chunk size is 4 kilobytes, Thus, every virtual chunk is stored in a physical NAND page.

Each chunk 501 includes a descriptor containing a mapping 505 from virtual chunk 501 to a physical location in Open Channel device 515. Mapping information 505 includes an identification (OC #) of Open Channel device 515, a block number (BLOCK #) within Open Channel SSD 515, and a page number (PAGE #) within the block number. Controller 101 can access mapping information 505 can be stored as metadata in memory. Mapping information 505 within each virtual chunk points 520 to a corresponding page 502 within a block 510 within an Open Channel SSD 515.

Figure 5B:
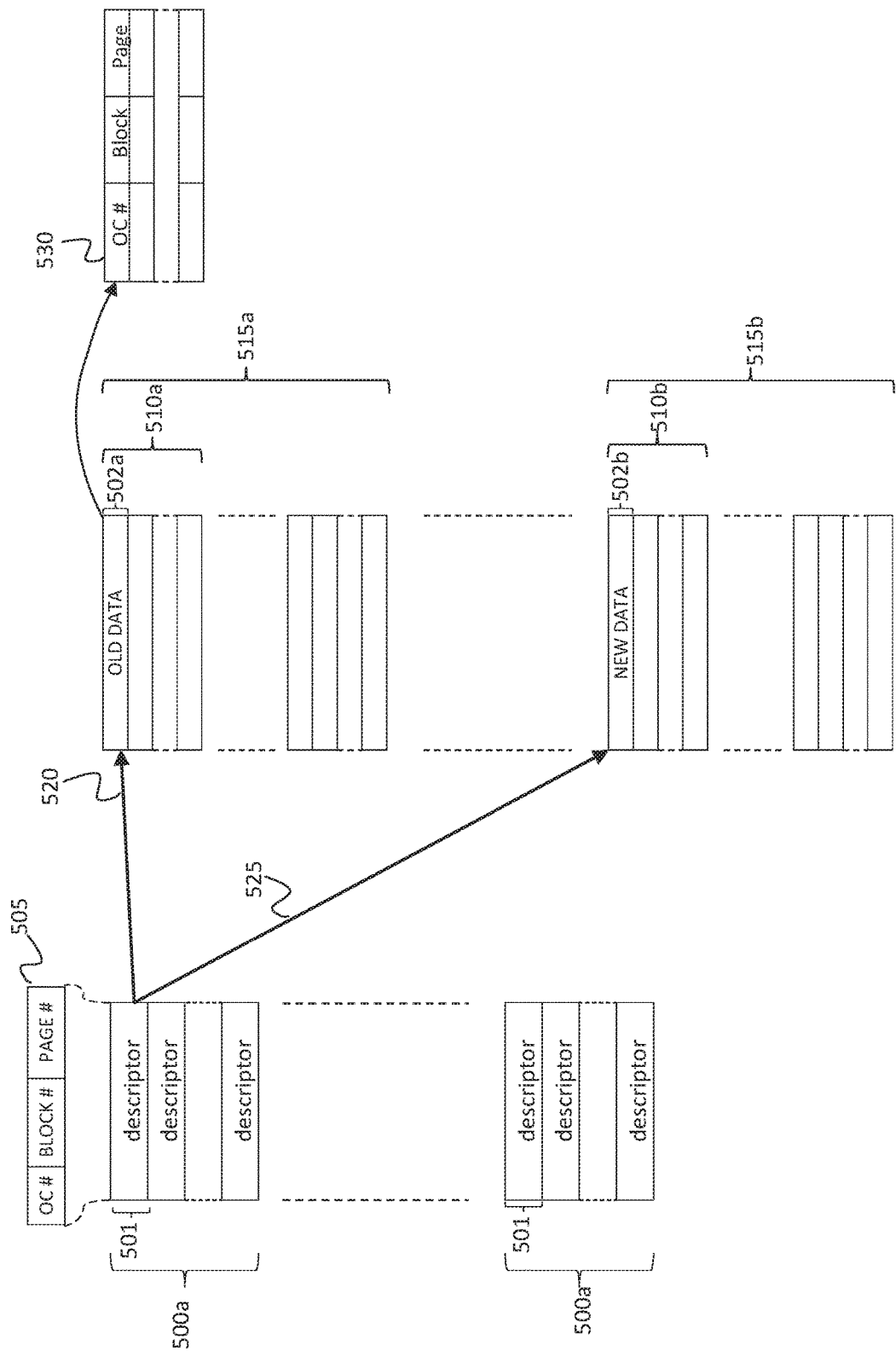
FIG. 5B is a diagram illustrating updating logical address to physical location mapping information, according to one embodiment of this invention.

FIG. 5B illustrates the process of updating mapping information 505 between a logical and physical address after selection of a different storage location during processing of an incoming command for an Open Channel SSD. Prior to receiving an write command, virtual chunk 501 in virtual address 500a originally contains mapping information 505 to an Open Channel device 515a, block 510a within Open Channel device 515a, and page 502a within block 510a. Upon receiving the command that requires processing (e.g., writing) data of virtual chunk 501, controller 101 uses mapping information 505 to identify the block 510a and page 502a within Open Channel SSD 515 to which the data is to be written. In one embodiment, controller 101 selects a different page 502b in block 510b, and subsequently write data to page 502b. This action can result from determining that device 515a exceeds a threshold value for power consumption, operating temperature, or number of erase counts. Controller 101 can place data from the command in new page 502b in device 510b. In addition, controller 101 modifies the descriptor of virtual chunk 501 such that it points 525 to page 502b. Invalid data list 530 stores old mapping information including page block 510a and page 502a. At a later point, a garbage collection operation clears data located in page 502a of block 510a and a trim command informs a remote host of the removal of data.

Figure 6:
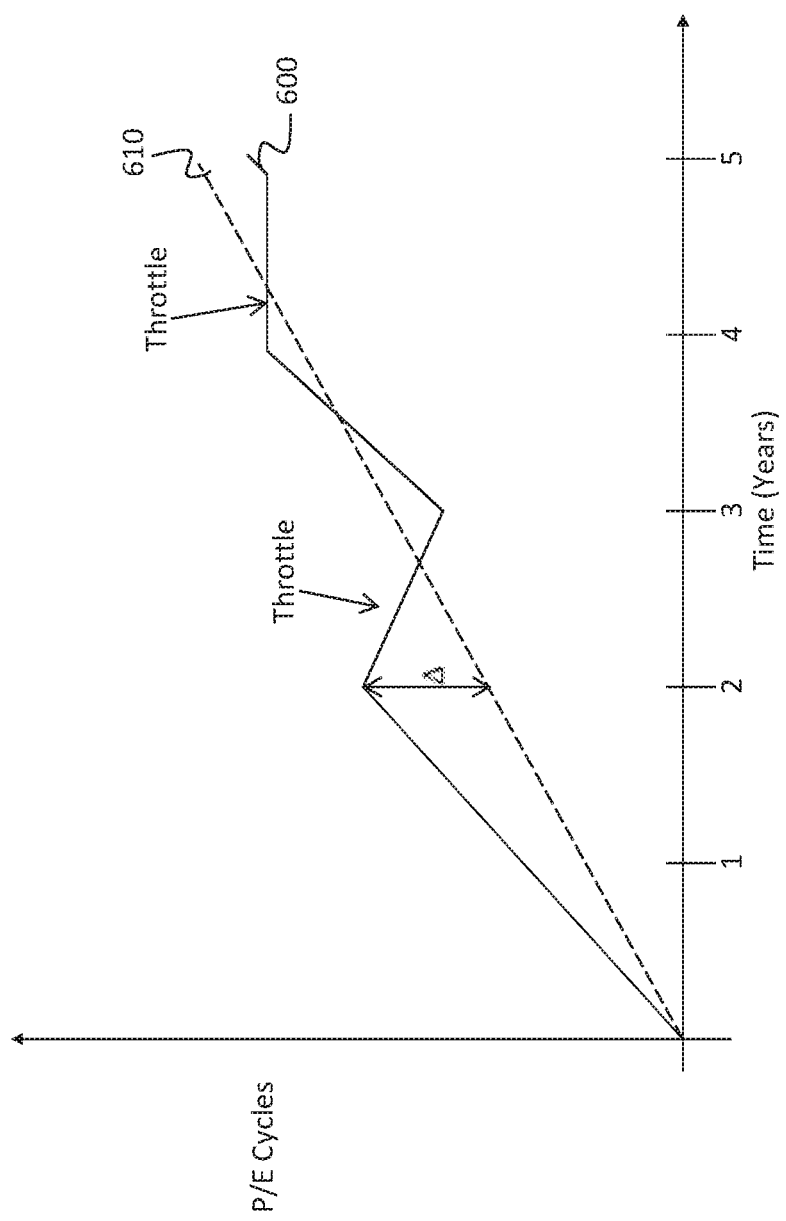
FIG. 6 illustrates the effect of throttling commands based on the expected lifetime of a storage system, according to one embodiment of the invention.

FIG. 6 shows the effect of throttling commands over a period of time, according to one embodiment of the invention. A storage system has a limited number of P/E cycles. Line 600 represents the actual P/E cycles of a storage device and dotted line 610 is the threshold P/E cycles for the storage device that is necessary to meet the expected lifetime for the storage device. A storage system according to one embodiment of the current invention executes rules to optimize write commands to control the P/E cycles of storage locations. When a value of the actual P/E cycles 600 exceeds the threshold P/E value 610 for a certain storage location, controller 101 executes rules to provide optimizing actions that throttle commands directed at the storage location. In one embodiment, the rule-based actions are triggered when the actual P/E cycles exceeds the threshold by a certain delta difference, Δ. A controller uses this delta to calculate a throttling value as discussed above.

FIG. 7 shows the effect of throttling commands based on the power usage (and by extension, the temperature) of a storage location. Line 700 represents actual power consumption of a storage location and dotted line 710 represents a predetermined threshold for the power consumption of the storage location. When a value of actual power consumption 700 exceeds the power consumption threshold 710, controller 101 can implement the rule-based actions as described above which results in optimization of the command. Optimization of the command includes, for example, throttling the command or selecting a different storage location for processing the command. The difference, Δ, between the actual and threshold power consumption, can be used to calculate a throttling value for the command, as discussed above.

Other objects, advantages and embodiments of the various aspects of the present invention will be apparent to those who are skilled in the field of the invention and are within the scope of the description and the accompanying figures. For example, but without limitation, structural or functional elements might be rearranged, or method steps reordered, consistent with the present invention. Similarly, principles according to the present invention could be applied to other examples, which, even if not specifically described here in detail, would nevertheless be within the scope of the present invention.

What is claimed is:

1. A method for dynamically optimizing processing of a command within a storage system, comprising:
   receiving a command to access a first nonvolatile memory storage location of a plurality of nonvolatile memory storage locations;
   determining that one or more internal operation parameters of the first nonvolatile memory storage location does not satisfy one or more predetermined internal operation criteria for the first nonvolatile memory storage location; and
   in response to the determination, setting a time of execution of the command to access the first nonvolatile memory storage location such that the one or more internal operation parameters of the first nonvolatile memory storage location will satisfy the one or more predetermined internal operation criteria upon execution of the command.

2. The method of claim 1, wherein a single solid state device (SSD) comprises the plurality of nonvolatile memory storage locations.

3. The method of claim 1, wherein the plurality of nonvolatile memory storage locations correspond to a plurality of SSDs.

4. The method of claim 1, wherein setting the time of execution of the command is based on a weighted function.

5. The method of claim 4, wherein the weighted function is based on one or more predetermined weighted variables and one or more differences, each difference of the one or more differences corresponding to a difference between a current value of a given internal operation parameter and a threshold value of the given internal operation parameter.

6. The method of claim 4, wherein the weighted function is based on one or more predetermined weighted variables and one or more internal operation parameters, respectively.

7. The method according to claim 1, wherein the one or more internal operation parameters for each of the plurality of nonvolatile memory storage locations of the storage system correspond to one or more of erase count, power consumption, current or average operating temperature, and amount of fragmentation.

8. The method of claim 1, wherein the one or more internal operation parameters correspond to at least one of a power consumption of the storage system, an internal temperature of the storage system, an erase count of the storage system, a number of free blocks within the storage system, and a fragmentation level of the storage system.

9. The method of claim 1, wherein the one or more internal operation parameters correspond to at least one of a power consumption of the storage system, a maximum or average internal temperature of the storage system, and a maximum erase count of the storage system.

10. The method of claim 1, wherein the one or more predetermined internal operation criteria correspond to one or more of a quality-of service level of the storage system, a service level agreement parameter of the storage system, and a life-time parameter of the storage system.

11. The method according to claim 1, further comprising:
    identifying the first nonvolatile memory storage location from the command;
    retrieving the one or more internal operation parameters of the first nonvolatile memory storage location; and
    comparing the one or more internal operation parameters of the first nonvolatile memory storage location with the one or more predetermined internal operation criteria for the first nonvolatile memory storage location.

12. A method for dynamically optimizing processing of a command within a storage system, comprising:
    receiving a command to access a first nonvolatile memory storage location of a plurality of nonvolatile memory storage locations;
    determining that one or more internal operation parameters of the first nonvolatile memory storage location does not satisfy one or more predetermined internal operation criteria for the first nonvolatile memory storage location; and
    in response to the determination, executing the command to a second nonvolatile memory storage location of the plurality of nonvolatile storage locations.

13. The method of claim 12, the method further comprising identifying the second nonvolatile memory storage location of the plurality of nonvolatile memory storage locations that is different from the first nonvolatile memory storage location.

14. The method of claim 12, the method further comprising:
    identifying the first nonvolatile memory storage location from the command;
    retrieving the one or more internal operation parameters of the first nonvolatile memory storage location; and
    comparing the one or more internal operation parameters of the first nonvolatile memory storage location with the predetermined internal operation criteria for the first nonvolatile memory storage location.

15. The method of claim 12, the method further comprising:
    comparing the one or more internal operation parameters with predetermined internal operation criteria for each of the plurality of non-volatile memory storage locations;
    ranking each of the plurality of non-volatile memory storage locations based on the comparison.

16. The method of 15, the method further comprising selecting a highest ranked nonvolatile storage location of the plurality of non-volatile memory storage locations as the second nonvolatile storage location.

17. The method of claim 12, wherein a single SSD comprises the plurality of nonvolatile memory storage locations.

18. The method of claim 12, wherein the plurality of nonvolatile memory storage locations correspond to a plurality of SSDs.

19. The method according to claim 12, wherein one or more internal operation parameters for each of the plurality of nonvolatile memory storage locations of the storage system correspond to one or more of erase count, power consumption, current or average operating temperature, and amount of fragmentation.

20. The method of claim 12, wherein the one or more internal operation parameters correspond at least one of a power consumption of the storage system, an internal temperature of the storage system, an erase count of the storage system, a number of free blocks within the storage system, and a fragmentation level of the storage system.

21. The method of claim 12, wherein the one or more internal operation parameters correspond to at least one of a power consumption of the storage system, a maximum or average internal temperature of the storage system, and a maximum erase count of the storage system.

22. The method of claim 12, wherein the one or more predetermined internal operation criteria correspond to one or more of a quality-of service level of the storage system, a service level agreement parameter.

* * * * *